United States Patent
Kishimoto et al.

(10) Patent No.: US 10,799,993 B2
(45) Date of Patent: Oct. 13, 2020

(54) VAPOR DEPOSITION APPARATUS, VAPOR DEPOSITION METHOD AND METHOD OF MANUFACTURING ORGANIC EL DISPLAY APPARATUS

(71) Applicant: Sakai Display Products Corporation, Osaka (JP)

(72) Inventors: Katsuhiko Kishimoto, Osaka (JP); Koshi Nishida, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 24 days.

(21) Appl. No.: 16/409,582

(22) Filed: May 10, 2019

(65) Prior Publication Data

US 2019/0262955 A1    Aug. 29, 2019

Related U.S. Application Data

(62) Division of application No. 15/767,646, filed as application No. PCT/JP2017/014150 on Apr. 4, 2017, now Pat. No. 10,335,909.

(51) Int. Cl.

| | | |
|---|---|---|
| B23Q 3/15 | (2006.01) | |
| C23C 14/24 | (2006.01) | |
| C23C 14/04 | (2006.01) | |
| H05B 33/10 | (2006.01) | |
| C23C 14/34 | (2006.01) | |
| H01L 51/50 | (2006.01) | |
| C23C 14/12 | (2006.01) | |
| H01L 51/00 | (2006.01) | |

(52) U.S. Cl.
CPC .............. *B23Q 3/15* (2013.01); *C23C 14/04* (2013.01); *C23C 14/042* (2013.01); *C23C 14/12* (2013.01);
(Continued)

(58) Field of Classification Search
CPC ........... B23Q 3/15; C23C 14/12; C23C 14/04; C23C 14/24; C23C 14/042; C23C 14/34;
(Continued)

(56) References Cited

U.S. PATENT DOCUMENTS

2012/0204794 A1*  8/2012  Ko ................... C23C 14/042
                                                                118/721

FOREIGN PATENT DOCUMENTS

| JP | S54148270 A | 11/1979 |
|---|---|---|
| JP | S6174416 A | 4/1986 |

(Continued)

OTHER PUBLICATIONS

JP-2010-209459; Kameyama Hiroki; Title: Organic El Device production device; film deposition system, organic El device production method, and film deposition method (Year: 2020).*

(Continued)

*Primary Examiner* — Dharti H Patel
(74) *Attorney, Agent, or Firm* — Snell & Wilmer L.L.P.

(57) ABSTRACT

A vapor deposition apparatus disclosed in an embodiment is configured to allow an electromagnet (3) to attract a vapor deposition mask, and comprises a control circuit (7) connected between the electromagnet (3) and a power supply circuit (6) for driving the electromagnet (3). The control circuit gradually changes a magnetic field to be generated by the electromagnet (3) when a current is applied to the electromagnet (3). As a result, the change in current to flow in an electromagnetic coil (32) of the electromagnet (3) becomes gradual and an effect of electromagnetic induction is reduced, thereby suppressing the defect of elements formed on a substrate for vapor deposition or the deterioration in property of the element.

9 Claims, 8 Drawing Sheets

(52) U.S. Cl.
CPC .............. *C23C 14/24* (2013.01); *C23C 14/34* (2013.01); *H01L 51/50* (2013.01); *H05B 33/10* (2013.01); *H01L 51/0011* (2013.01); *H01L 51/5056* (2013.01); *H01L 51/5092* (2013.01)

(58) Field of Classification Search
CPC . H01L 51/50; H01L 51/0011; H01L 51/5056; H01L 51/5092; H05B 33/10
USPC .......................................................... 361/143
See application file for complete search history.

(56) References Cited

FOREIGN PATENT DOCUMENTS

| | | |
|---|---|---|
| JP | 2005036839 A | 2/2005 |
| JP | 2005515080 A | 5/2005 |
| JP | 2008024956 A | 2/2008 |
| JP | 2010209459 A | 9/2010 |
| JP | 2013089586 A | 5/2013 |
| JP | 2014154315 A | 8/2014 |
| WO | 03009972 A2 | 2/2003 |
| WO | 2011114829 A1 | 9/2011 |

OTHER PUBLICATIONS

PCT International Search Report, PCT Application No. PCT/JP2017/014150, Japan Patent Office. dated Jun. 2, 2017.

English Translation of PCT International Search Report, PCT Application No. PCT/JP2017/014150, Japan Patent Office. dated Jun. 2, 2017.

PCT International Preliminary Report on Patentability, PCT Application No. PCT/JP2017/014150, Japan Patent Office, dated Oct. 19, 2017.

* cited by examiner

VAPOR DEPOSITION APPARATUS, VAPOR DEPOSITION METHOD AND METHOD OF MANUFACTURING ORGANIC EL DISPLAY APPARATUS

CROSS-REFERENCE TO RELATED APPLICATIONS

This patent application is a divisional patent application of co-pending U.S. application Ser. No. 15/767,646, having a filing/§ 371(c) date of Apr. 12, 2018, which is a U.S. National Stage of PCT/JP2017/014150, having an international filing date of Apr. 4, 2017. The entire disclosure of each patent application set forth in this CROSS-REFERENCE TO RELATED APPLICATIONS section is hereby incorporated by reference.

TECHNICAL FIELD

The present invention relates to a vapor deposition apparatus for, for example, vapor-depositing an organic layer for an organic EL display apparatus, a vapor deposition method, and a method of manufacturing an organic EL display apparatus.

BACKGROUND ART

For example, when manufacturing an organic EL display apparatus, switching elements such as TFTs are formed on a support substrate and depositing an organic layer corresponding to each pixel is deposited on an electrode of the switching element. The organic layer is sensitive to water and cannot be etched. Therefore, the deposition of the organic layer is performed by arranging a vapor deposition mask and the support substrate (a substrate for vapor deposition) so as to overlap each other, and then by vapor-depositing an organic material through an opening of the vapor deposition mask. It results in that a necessary organic material is deposited only on the electrode of necessary pixels. Unless the substrate for vapor deposition and the vapor deposition mask are arranged as close as possible to each other, it is not possible to form the organic layers only in a precise area of the pixel. Unless the organic material is deposited only in a precise area of the pixel, the display image tends to blur. Thus, a magnetic chuck is used to be close to the substrate for vapor deposition and the vapor deposition mask together by using a magnetic substance for the vapor deposition mask and interposing the substrate for vapor deposition between a permanent magnet or an electromagnet and the vapor deposition mask (for example, refer to Patent Document 1).

PRIOR ART DOCUMENTS

Patent Document
Patent Document 1: JP 2008-024956 A

SUMMARY OF THE INVENTION

Problem to be Solved by the Invention

Although metal mask has been conventionally used as a vapor deposition mask, recently there is a tendency that a hybrid-type vapor deposition mask is used in which the mask is formed of a resin film having an opening, and a metal support layer, which supports on the periphery of the opening, in order to form a finer opening pattern. For a vapor deposition mask with a small amount of magnetic substance, such as a hybrid mask, sufficient attraction is not obtained unless a stronger magnetic field is used.

As described above, if the attraction is not sufficient, the closeness between the substrate for vapor deposition and the vapor deposition mask is reduced. In order to sufficiently attract the vapor deposition mask to the substrate for vapor deposition, a strong magnetic field is required. When a permanent magnet is used as a magnet in the magnetic chuck, and if its magnetic field is strong, an alignment of the substrate for vapor deposition with the vapor deposition mask becomes difficult. On the other hand, when an electromagnet is used, the alignment of the substrate for vapor deposition with the vapor deposition mask becomes easy because a magnetic field can be applied after the alignment, while the magnetic field is not applied during the alignment. However, the present inventors have found that applying a strong magnetic field after the alignment of the substrate for vapor deposition with the vapor deposition mask using an electromagnet may lead a defective performance or deterioration in property of the TFTs of the substrate for vapor deposition or the deposition layer made of the organic material. In particular, when the hybrid type vapor deposition mask is used, a strong magnetic field is required to obtain sufficient attraction. In this case, the strength of the magnetic field will be increased at most about twice, but not as much as a large electromagnet requires. However, even when an electromagnet for the conventional metal mask is used, the magnetic flux of which changes drastically at the time of current input, and when the current increases, the change of magnetic flux becomes more evident. The present inventors have found that the electromagnetic induction produced at the time of current input may lead a significant defect in the TFTs formed on the substrate for vapor deposition or deterioration of the organic layer.

The present invention has been made to solve these problems, and an object of the present invention is to provide a vapor deposition apparatus and a vapor deposition method which suppress the defect or deterioration of elements such as TFTs formed on the substrate for vapor deposition as well as the deterioration in property of the organic layer, even when an electromagnet is used as a magnet for a magnetic chuck.

Another object of the present invention is to provide a method of manufacturing an organic EL display apparatus with an excellent display quality by using the above-described vapor deposition method.

Means for Solving the Problem

The vapor deposition apparatus according to the present invention comprises: an electromagnet; a substrate holder for holding a substrate for vapor deposition to be placed in a position facing one magnetic pole of the electromagnet; a vapor deposition mask comprising a magnetic substance and provided at a surface of the substrate for vapor deposition held by the substrate holder, the surface being an opposite surface to a surface facing the one magnetic pole of the electromagnet; a vapor deposition source provided so as to face the vapor deposition mask and configured to evaporate or sublimate a vapor deposition material; a power supply circuit for driving the electromagnet; and a control circuit connected between the power supply circuit and the electromagnet to gradually change a magnetic field provided by the electromagnet when a current is applied to the electromagnet.

The vapor deposition method according to an embodiment of the present invention comprises: overlapping an electromagnet, a substrate for vapor deposition and a vapor deposition mask comprising a magnetic substance, and attracting the substrate for vapor deposition and the vapor deposition mask to the electromagnet by applying a current from a power supply circuit to the electromagnet; and depositing a vapor deposition material on the substrate for vapor deposition by allowing the vapor deposition material to travel from a vapor deposition source disposed separately from the vapor deposition mask, wherein, when attracting the vapor deposition mask to the electromagnet, the application of the current to the electromagnet is performed so as to gradually change a magnetic field provided by the electromagnet.

The method of manufacturing an organic EL display apparatus according to an embodiment of the present invention comprises: forming at least TFTs and a first electrode on a support substrate; forming an deposition layer made of organic materials on the support substrate by vapor-depositing an organic material using the above-described vapor deposition method; and forming a second electrode on the deposition layer.

Effects of the Invention

According to the vapor deposition apparatus and the vapor deposition method illustrated in an exemplary embodiment of the present invention, the defect or deterioration of the elements such as TFTs formed on the substrate for vapor deposition as well as the deterioration in property of the organic layer can be suppressed.

EMBODIMENT FOR CARRYING OUT THE INVENTION

Figure 1A:
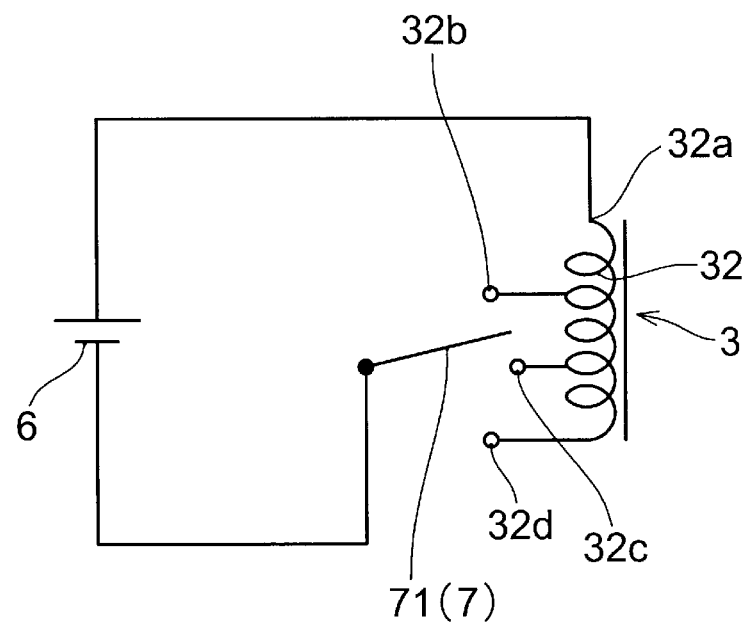
FIG. 1A shows a circuit diagram of a first example of a control circuit used in a vapor deposition apparatus according to an embodiment of the present invention.

Next, referring to the drawings, a vapor deposition apparatus and a vapor deposition method according to an embodiment of the present invention will be described. An example of overall configuration of the vapor deposition apparatus according to the present embodiment is shown in FIG. 5A, and a circuit diagram of a first example of a control circuit of the apparatus is shown in FIG. 1A. As shown in FIG. 5A, the apparatus includes: an electromagnet 3; a substrate holder 29 for holding a substrate for vapor deposition 2 to be placed in a position facing one magnetic pole of the electromagnet 3; a vapor deposition mask 1 including a magnetic substance and provided at a surface of the substrate for vapor deposition 2 held by the substrate holder 29, the surface being an opposite surface to a surface facing the one magnetic pole of the electromagnet 3; and a vapor deposition source 5 placed so as to face the vapor deposition mask 1 and configured to evaporate or sublimate a vapor deposition material. In addition, as shown in FIGS. 1A to 4A, it further includes a power supply circuit 6 for driving the electromagnet 3, and a control circuit 7 connected between the power supply circuit 6 and the electromagnet 3 to gradually change a magnetic field provided by the electromagnet 3 when a current is applied to the electromagnet 3.

The term "gradually" as used herein refers to increasing a rise time of the current, in particular, increasing it to, for example, 100 times more of the conventional rise time, and, more specifically refers that a rise time (a time from when a switch is turned on to when a current reaches a predetermined value) is on the order of milliseconds.

Figure 5A:
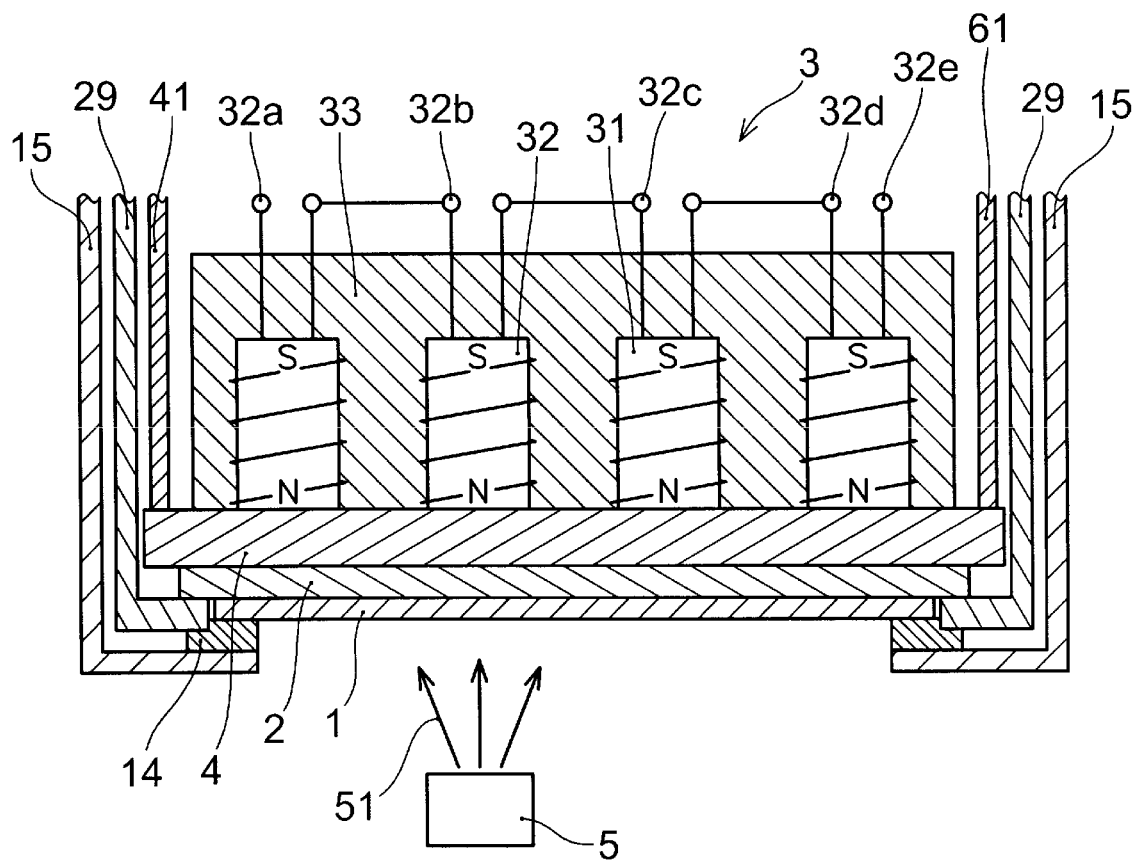
FIG. 5A shows a relationship among an electromagnet, a substrate for vapor deposition and a vapor deposition mask for the vapor deposition apparatus.
Figure 6:
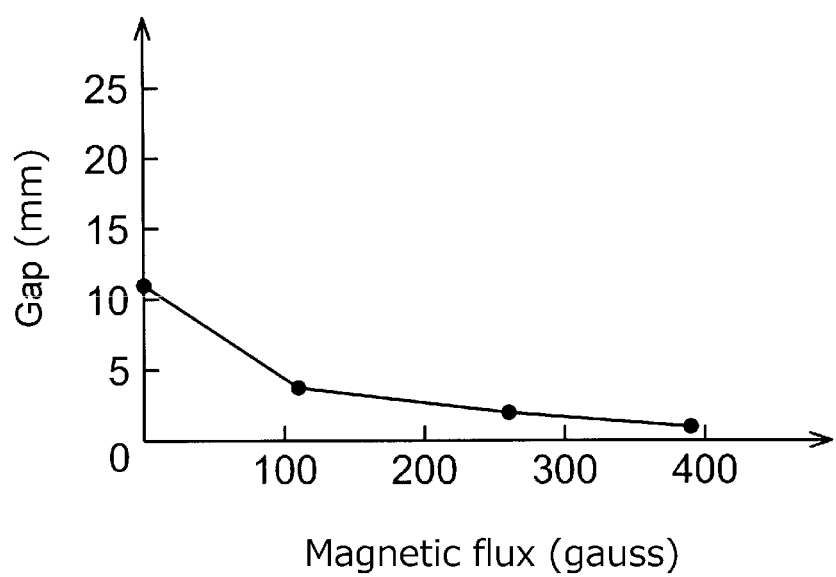
FIG. 6 shows a relationship between a magnetic flux and a distance between the substrate for vapor deposition and the vapor deposition mask.

Here, in order to obtain a sufficient closeness between the vapor deposition mask 1 and the substrate for vapor deposition 2, the present inventors examined the relationship between a magnetic flux and a gap between the vapor deposition mask 1 and the substrate for vapor deposition 2 by using the configuration as shown in FIG. 5A, but using a permanent magnet instead of the electromagnet and overlapping the permanent magnet, a touch plate 4, the substrate for vapor deposition 2 and the vapor deposition mask 1. FIG. 6 shows the results. In the presently illustrated embodiment, a sheet magnet which generates a magnetic field on one surface but generates no magnetic field on the other surface (which is, the magnitude of magnetic field is zero) was used as a permanent magnet. Three sheets of permanent magnets with different magnetic fields were prepared, and the relationship between the magnetic field on the surface of the vapor deposition mask 1 and the gap between the substrate for vapor deposition 2 and the vapor deposition mask 1 was investigated while exchanging the three sheets of permanent magnets. A hybrid-type mask was used as the vapor deposition mask 1. It should be noted that it is known, from the results of studying a relationship between a gap and a deposition state of an organic material, that the smaller the gap between the substrate for vapor deposition 2 and the vapor deposition mask 1, the more preferable the deposition state will be, and a desired deposition state can be obtained when the gap is 3 µm or smaller.

From the results of the study shown in FIG. 6, it is appreciated that the higher magnetic field H or magnetic flux density B (B=µH where µ is permeability) of the magnet is preferred. However, as described above, the present inventors have found that when the substrate for vapor deposition 2 and the vapor deposition mask 1 are in contact with each other by attracting the vapor deposition mask 1 to the electromagnet 3 under a strong magnetic field, the elements such as TFTs formed on the substrate for vapor deposition 2 may be damaged or the quality of which may be deteriorated. Further, it was also found that the organic material can be deteriorated. The present inventors further conducted extensive studies to investigate their causes, and as a result, have found that at the time of current input to an electromagnetic coil 32 of the electromagnet 3 an overcurrent flows in circuits such as TFTs (not shown) formed on the substrate for vapor deposition 2 due to an electromotive force by electromagnetic induction. Further, the present inventors have found that the TFTs and the organic layer 25 (refer to FIG. 7B) are damaged or deteriorated due to the overcurrent as well as Joule heat generated by the overcurrent in, for example, an electrode 22 (refer to FIG. 7B).

When the power supply circuit 6 (refer to FIG. 1A) allows a current to flow in the electromagnetic coil 32 of the electromagnet 3, the current flows rapidly, and the rapid current flow causes a rapid increasement of a magnetic flux $\Phi$ (($\Phi$=BS=µHS, where S is cross-sectional area of a core) generated by the electromagnet 3. When the magnetic flux $\Phi$ changes rapidly, an electromotive force corresponding to V which is proportional to $-d\Phi/dt$ is generated. A time $\Delta t$ (rise time) from when a current is 0 to when a current reaches a predetermined value after the current input to the electromagnetic coil 32 depends on the magnitude of the self-inductance of the electromagnet 3, which is about 10 µs (micro-second) for a conventional electromagnet 3. Since $\Delta t$ is very small, the minute time dt can be approximated by this $\Delta t$. Thus, for example, if the magnetic flux of about 300 gauss is changed by this time $\Delta t$, an electromotive force of about 30 MV will be generated by electromagnetic induction. This electromotive force causes a current to flow in a closed circuit in the substrate for vapor deposition 2, thereby causing a damage to the TFTs and so on. As can be recognized from the above expression, the bigger the change in the magnetic flux $\Phi$ and the smaller the time variation, the higher this electromotive force V will be. Since the electromagnetic coil 32 of the electromagnet 3 has a self-inductance, the change in the magnetic flux $\Phi$ is suppressed, but nevertheless, a high induced electromotive force of the above-described, about 30 MV is generated, and it indicates that such a magnitude of induced electromotive force causes the damage or deterioration in property of the elements. Further, heat as expressed by $Q=V^2 \cdot t/R$ (where R is an electric resistance ($\Omega$) of the closed circuit on the substrate for vapor deposition 2) is generated as an amount of the Joule heat Q (J). As an organic material is sensitive to a high temperature, the property of the organic material may be deteriorated by the generation of this Joule heat.

The present inventors further conducted extensive studies for investigation, and as a result, have found that by changing a magnitude of a magnetomotive force (N·I, where N is the number of turns of the coil, and I is a magnitude of the current to flow in the electromagnetic coil) generated by the electromagnet 3 such that it gradually increases, the change of the magnetic flux to be generated becomes gradual, making it possible to solve such a problem. More specifically, it has been found that if not only the self-inductance of the electromagnet 3 but also the number of turns N or the current I of the electromagnetic coil 32 is gradually increased, or the rise time $\Delta t$ is increased, the induced electromotive force can be reduced, making it possible to solve this problem. Even more specifically, it has been found that if the rise time $\Delta t$ is increased to about 100 times more of the conventional rise time, more preferably about 1000 times, the induced electromotive force can be reduced to about one thousandth, making it possible to solve the problem. Examples of concrete method to gradually change the magnetic flux include a method to gradually increase the magnetomotive force itself to be applied to the electromagnet 3, for example, gradually increasing the number of turns or current of the electromagnetic coil 32, or gradually increasing the current to be applied to the electromagnetic coil 32 by using a delay circuit, for example, a chopper or a reactance element such as a capacitor. It has been found that slowing the rise of the magnetomotive force (magnetic field) which causes the electromagnetic induction can prevent a damage or deterioration of the elements such as TFTs or the organic layer formed on the substrate for vapor deposition 2.

In order to reduce the induced electromotive force, it is necessary to make the change in magnetic flux $\Phi$ small as described above. The dt can be approximately estimated as a time from when the magnetic flux is 0 to when it reaches $\Phi$. Thus, this means that it is only necessary to increase a time $\Delta t$ until the magnetic field reaches a predetermined value, for example, shown in FIG. 1B. As described above, this $\Delta t$ can be set to about 1000 times of the $\Delta t$ with no delay, more specifically to about 10 ms (milliseconds). It should be noted that the above description has been made for when the current is applied to the electromagnetic coil 32 of the electromagnet 3, however, also when the current is turned off in order to make the magnetic flux $\Phi 0$ (zero), the magnetic flux similarly changes rapidly. Thus, also in this case, reverse induced electromotive force is generated, causing a similar problem. However, this problem can be solved by incorporating tap control or a delay circuit, similarly to the case when the current is turned on. The specific examples will be described in further detail with reference to FIGS. 1A to 4B.

Example 1

Figure 1B:
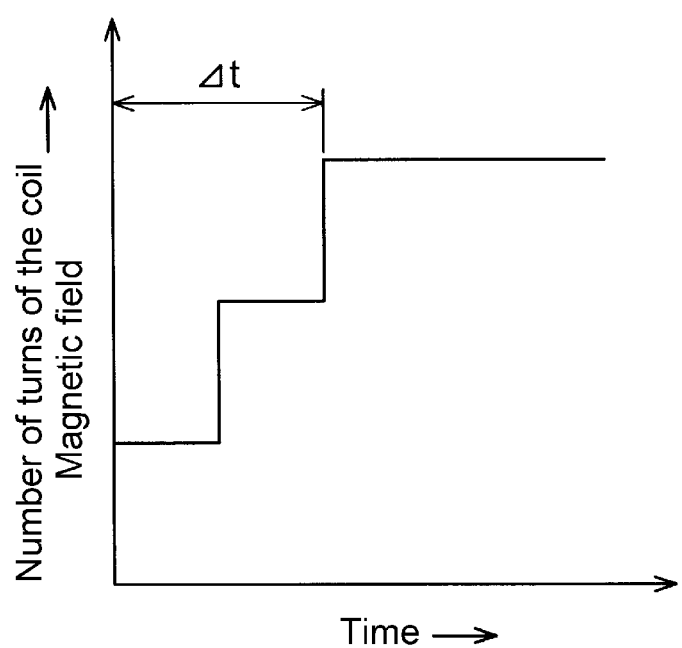
FIG. 1B shows a change in magnetic field H in the circuit exemplified in FIG. 1A after input of a current.

The exemplary embodiment shown in FIGS. 1A and 1B has a configuration in which a plurality of taps 32b, 32c, 32d are formed on an electromagnetic coil 32 of an electromagnet 3, and a switch 71 is sequentially rotated to be sequentially connected from the tap 32b to the tap 32c. Magnetic flux $\Phi$ is $\Phi$=N·I, where N is the number of turns of coil, and I is current. For example, when the switch 71 is connected to the tap 32b, the current flows only in about one third of the electromagnetic coil 32 shown in FIG. 1A. As a result, the number of turns will be about one third, and the magnetic flux $\Phi$=N·I/3. Then, by sequentially connecting the switch 71 to the tap 32c and then 32d, the magnetic flux $\Phi$ can be gradually increased. Consequently, the change in magnetic flux $\Phi$ is reduced, and thus there would be almost no effect of electromagnetic induction. The number of taps 32b to 32d is not limited to the one presently illustrated in the example, and it can be set to any number in a range that substantially prevents the effect of electromagnetic induction. The rise time can be further delayed by increasing the switching time of the switch 71. When the length of the electromagnetic coil 32 is changed, and if the length of the electromagnetic coil 32 is different, technically the resistance value of the electromagnetic coil 32 is changed, resulting in the change of the current I. However, this change would be negligible because the electromagnetic coil 32 is formed so that it has a resistance as low as possible.

FIG. 1B shows a change of the magnetic field H (or the number N of turns of the electromagnetic coil 32) by the control circuit 7 shown in FIG. 1A relative to the time. The change indicated on the vertical axis can be arbitrarily adjusted by the number of taps 32a to 32c, while the interval indicated on the horizontal axis by the switching speed of the switch 71.

Example 2

Figure 2A:
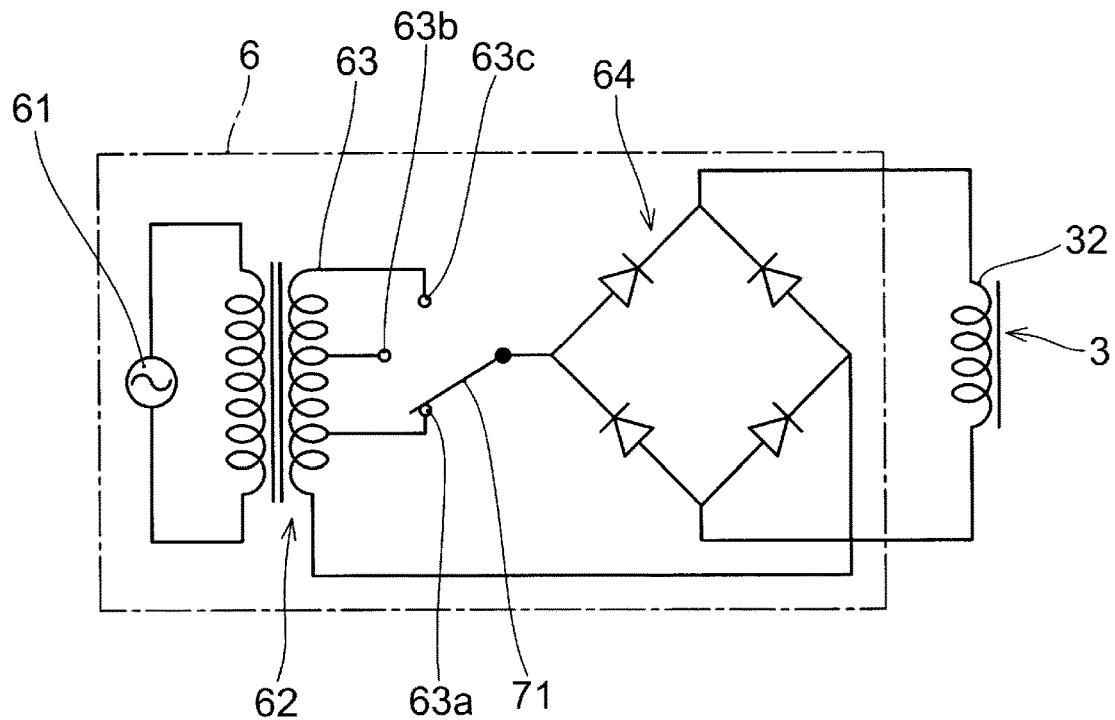
FIG. 2A shows a circuit diagram of a second example of a control circuit used in the vapor deposition apparatus according to the embodiment of the present invention.

The exemplary embodiment shown in FIG. 2A includes a power supply circuit 6 including an AC power supply 61 and a rectifier circuit 64, and the voltage of the AC power supply 61 can be changed by switching between taps 63a to 63c of a secondary coil 63 of a transformer 62. In the exemplary embodiment shown in FIG. 2A, the three taps 63a, 63b, 63c are formed on the secondary coil 63, and the switch 71 switches between the respective taps 63a to 63c. The output terminal is connected to the rectifier circuit 64. The rectifier circuit 64 may be a usual rectifier circuit including bridge connected four diodes, and its output is connected to an electromagnetic coil 32 of an electromagnet 3. In the exemplary embodiment shown in FIG. 2A, when the switch 71 is connected to the tap 63a, only about one third or so of the secondary coil 63 of the transformer 62 is used for output. Thus, the rectified DC output current uses only about one third of the output which appears in the secondary coil 63 of the transformer 62, resulting in a magnetomotive force due to a small current. Namely, in the state that the switch 71 is connected to the tap 63a, the current to flow in the electromagnetic coil 32 becomes about one third, resulting in the magnetic flux Φ (magnetic field H) of Φ=N·I/3, which produces small magnetic flux (magnetic field), similarly to the above-described embodiment shown in FIG. 1A. Then, by switching between the taps 63a to 63c, a desired magnetic flux (magnetic field) can be obtained in about 10 ms as described above. Therefore, the magnetic field is low only during a start-up period, and the finally obtainable attraction force to the vapor deposition mask 1 is not affected at all.

Figure 2B:
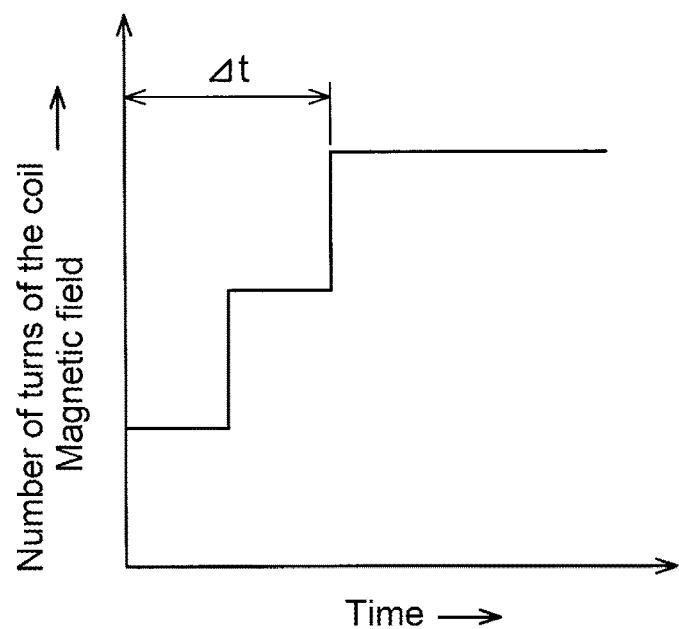
FIG. 2B shows a change in magnetic field H in the circuit exemplified in FIG. 2A after input of a current.

The change in the magnetic flux Φ (magnetic field H or current I) by the control circuit 7 shown in FIG. 2A can be similar to that shown in FIG. 1B, as shown in FIG. 2B. Also in this case, the change indicated on the vertical axis can be arbitrarily adjusted by the number of taps 63a to 63c, while the time intervals indicated on the horizontal axis can be arbitrarily adjusted by the switching speed of the switch 71.

Example 3

Figure 3A:
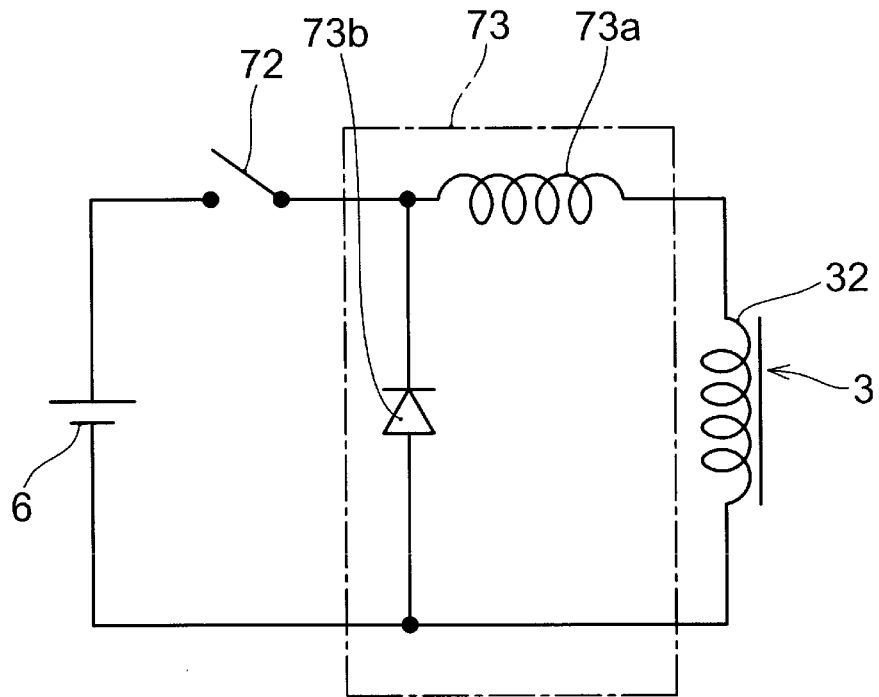
FIG. 3A shows a circuit diagram of a third example of a control circuit used in the vapor deposition apparatus according to the embodiment of the present invention.

The exemplary embodiment shown in FIG. 3A uses a so-called chopper circuit, which is configured so that a current is allowed to flow intermittently from a power supply circuit 6, thereby delaying its rise. A switch 72 and a smoothing circuit 73 including a smoothing coil 73a and a diode 73b are connected between the power supply circuit 6 (DC power supply) and an electromagnetic coil 32 of an electromagnet 3. The smoothing coil 73a is connected in series between the switch 72 and one terminal of the electromagnetic coil 32 of the electromagnet 3, while the diode 73b is connected in parallel to the electromagnet 3 between the switch 72 and the other terminal of the electromagnetic coil 32 of the electromagnet 3. By turning the switch 72 on and off during the current rise, since the current flows through the diode 73b by the energy stored in the smoothing coil 73a even during the off time, the current does not become completely 0 (zero) but simply decreases only slightly, and when the switch 72 is turned on again, the current rises again. This behavior is schematically shown in FIG. 3B.

Figure 3B:
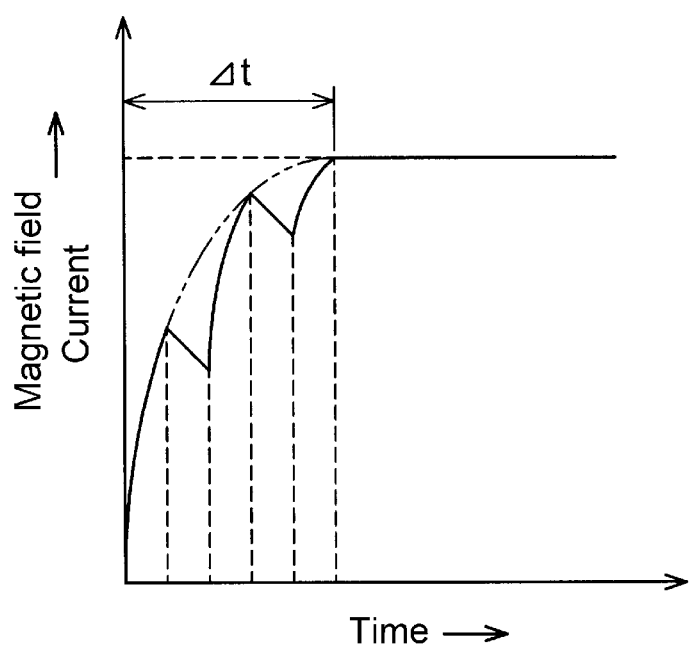
FIG. 3B shows a change in magnetic field H in the circuit exemplified in FIG. 3A after a current inputs.

In FIG. 3B, the part of the right upward curve corresponds to the state in which the switch 72 is turned on, while the part of the right downward line (it is conveniently depicted as a linear line although it is not actually a linear line) corresponds to the state in which the switch 72 is turned off. When the change in the current (magnetic field) is approximately depicted, it appears as a two-dot chain line as shown in FIG. 3B. In other words, such a chopper circuit 73 also can make the rise of magnetic flux gradual. Although the rise of magnetic flux is delayed by chopping with the switch 72, it still is affected by the smoothing coil 73a. Thus, the smoothing circuit 73 of FIG. 3A can be considered as a delay circuit using an inductive reactance.

Figure 3C:
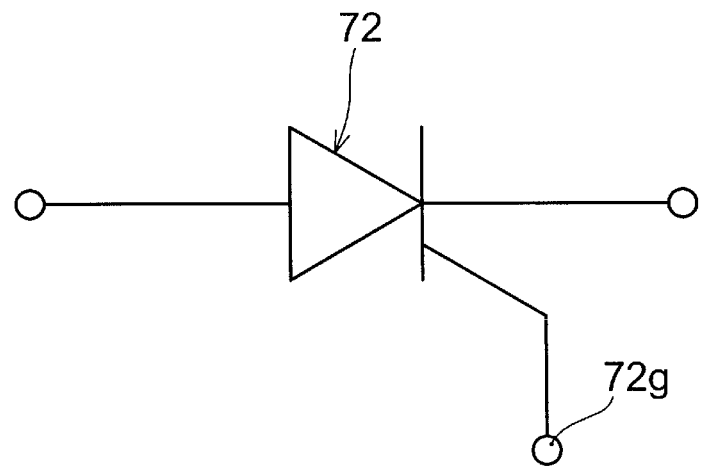
FIG. 3C shows an example of a switching circuit in FIG. 3A.

As a switch 72, a thyristor as shown in FIG. 3C, for example, may be used. A thyristor 72 is formed with, for example, a pnpn junction and includes a gate terminal 72g formed on an inner p-layer. A semiconductor switching element is connected to the gate terminal 72g, and the thyristor 72 is on/off controlled by switching the semiconductor switching element at high speed. The on/off control can be performed by the gate terminal using, for example, a bipolar transistor for high power, a field effect transistor (including MOS type and junction type), a GTO, an IGBT or the like instead of the thyristor. Further, if the power supply circuit is AC, a diode may also be used.

Figure 3D:
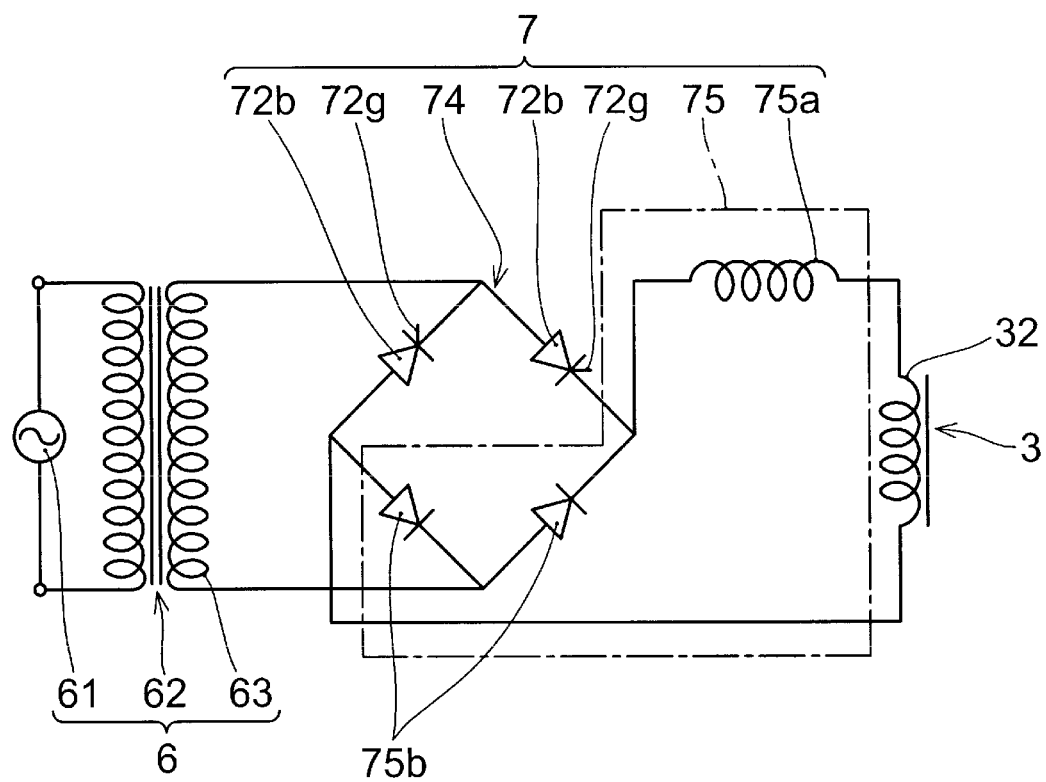
FIG. 3D shows a modified example of the circuit of FIG. 3A, in which an AC power supply is rectified when used.

A circuit shown in FIG. 3D is a modified embodiment of the embodiment shown in FIG. 3A, in which a control circuit 7 is formed by using an AC power supply 61 and integrating switches, a rectifier circuit 74 and a smoothing circuit 75. The rectifier circuit 74 for converting AC to DC is formed of a bridge circuit including the two thyristors 72b and two diodes 75b which also serve as switches. The smoothing circuit 75 is formed of the diodes 75b and a smoothing coil 75a. This circuit can chop even when the input is AC, similarly to the configuration with DC input shown in FIG. 3A. This control circuit 7 can rectify AC by the chopping so as to supply DC to the electromagnet 3, making the increase in magnetic flux gradual, similarly to the circuit shown in FIG. 3A.

Example 4

Figure 4A:
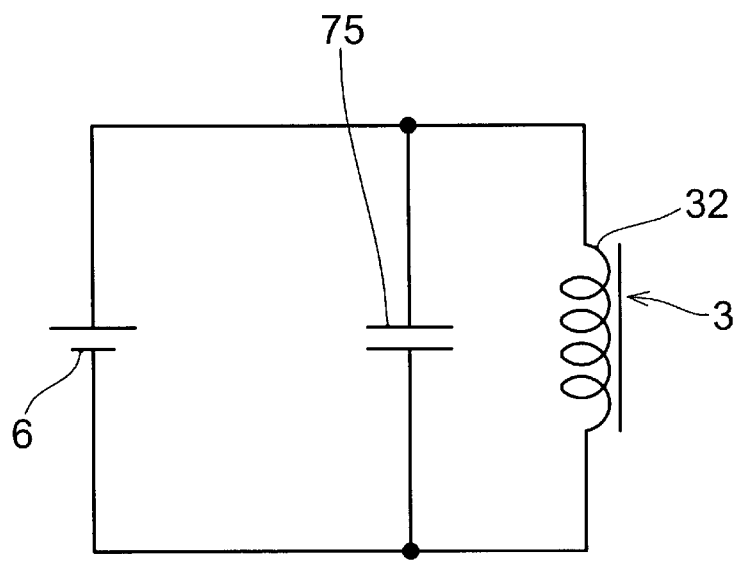
FIG. 4A shows a circuit diagram of a fourth example of the control circuit used in the vapor deposition apparatus according to the embodiment of the present invention.
Figure 4B:
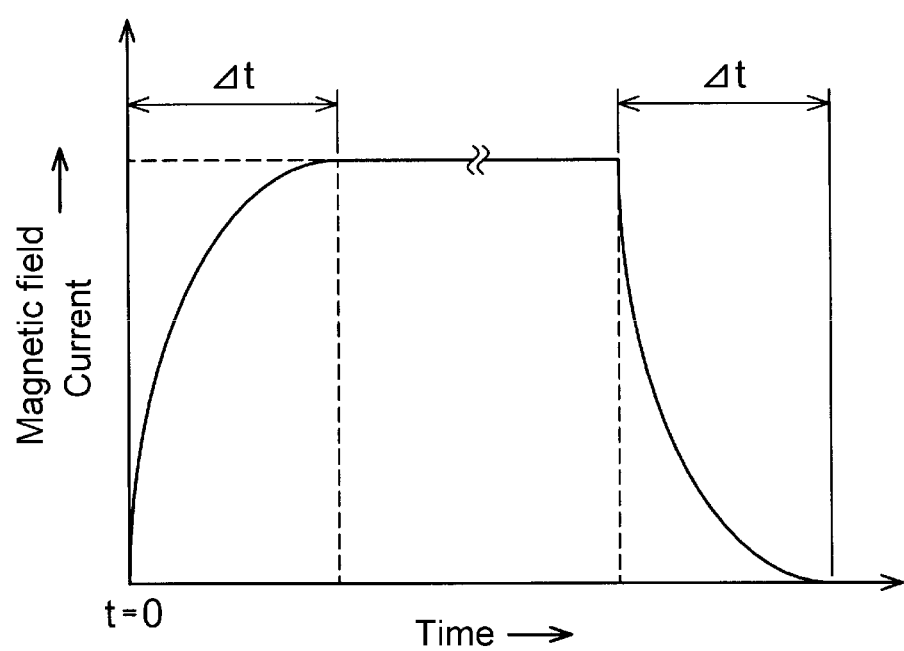
FIG. 4B shows a change in magnetic field H in the circuit exemplified in FIG. 4A after a current inputs.

FIG. 4A shows a configuration in which a capacitor 75 is connected in parallel to an electromagnet 3 between a power supply circuit 6 and the electromagnet 3. This configuration enables to increase firstly a current flowing in the capacitor 75 when the power supply circuit 6 outputs current, and then, as the capacitor 75 is charged, the current flowing in an electromagnetic coil 32 increases. Thus, as shown in FIG. 4B, the current flowing in the electromagnetic coil 32 of the electromagnet 3 (magnetic field) increases gradually. Provided that R is resistance of the electromagnetic coil 32 and C is capacitance of the capacitor 75, a time Δt requiring for a current to gradually increase and reach a predetermined current value relates to a time constant τ=R·C. As described above, it is necessary to set this Δt to about 10 ms or more. On the other hand, when a copper wire with a diameter of about 1 mm (resistivity of $1.71 \times 10^{-8}$ Ω·m) is used for an electromagnetic coil 32, the resistance R is 0.2Ω when the length of wire is 100 m. Then, the required capacitance C of the capacitor will be 0.01 (s)/0.2(Ω)=0.05 F (F: farad)=50 mF=50000 μF. Considering a possibility that an aluminum wire, for example, having a higher resistivity than the copper wire (it is known that its resistivity is about two times higher than that of the copper) may be used, or, considering optimizing the coil (decreasing the coil wire diameter or increasing the coil length should increase the resistance to about 5 times) in order to reduce the capacitance as much as possible in the future application, it is preferred to set the capacitance of the capacitor 75 to 5000 μF or more.

Even in the examples described above, also when the power supply circuit 6 is turned off, a rapid change in magnetic flux causes a generation of electromagnetic induction, and therefore it is necessary to be disconnected through a similar circuit. FIG. 4B also shows a change in current when disconnected. More specifically, even when the circuit is cut off by a switch (not shown), the charge stored in the capacitor 75 is discharged, decreasing the current gradually. Thus, it is desirable to provide a capacitor 75 since it not only allows the rising current to increase gradually, but also allows the falling current to decrease gradually. In other words, in order to make the falling gradual, a control similar to the one to make the rise gradual will be required at a disconnection of the switching circuit, however when an inductive reactance is used, that is, when a capacitor is used, a gradual fall can be obtained automatically.

As shown in FIG. 5A, a vapor deposition apparatus according to an exemplary embodiment of the present invention (a power supply circuit 6 and a control circuit 7 are not shown) includes: an electromagnet 3 arranged on a touch plate 4; a substrate holder 29 provided so as to hold a substrate for vapor deposition 2 at a magnetic pole surface of the electromagnet 3 via the touch plate 4; a vapor deposition mask 1 provided on a surface of the substrate for vapor deposition 2 held by the substrate holder 29, the surface opposite to the electromagnet 3; and a vapor deposition source 5 provided so as to face the vapor deposition mask 1 and configured to evaporate or sublimate a vapor deposition material. The vapor deposition mask 1 includes a metal layer made of a magnetic substance (a metal support layer 12: refer to FIG. 5B), and the electromagnet 3 is connected to the power supply circuit 6 and the control circuit 7 (refer to FIGS. 1A to 4A) for applying a current to an electromagnetic coil 32 so as to attract the metal support layer 12 of the vapor deposition mask 1. The vapor deposition mask 1 is arranged on a mask holder 15, and the substrate holder 29 and a support frame 41 for supporting the touch plate 4 are configured to be lifted up. The substrate for vapor deposition 2 carried by a robot arm (not shown) is disposed on the substrate holder 29, and the substrate holder 29 is moved down, then the substrate for vapor deposition 2 contacts with the vapor deposition mask 1. Further, by moving the support frame 41 down, the touch plate 4 is overlapped with the substrate for vapor deposition 2. The electromagnet 3 is mounted on the touch plate 4 by an operation of an electromagnet support member (not shown). It will be appreciated that the touch plate 4 is provided to flatten the substrate for vapor deposition 2 as well as to cool the substrate for vapor deposition 2 and the vapor deposition mask 1 by circulating the cooling water therein (not shown). The material and thickness of the touch plate 4 may be determined so as to uniformize the in-plane distribution of magnetic field on the side of the vapor deposition mask 1.

Figure 5B:
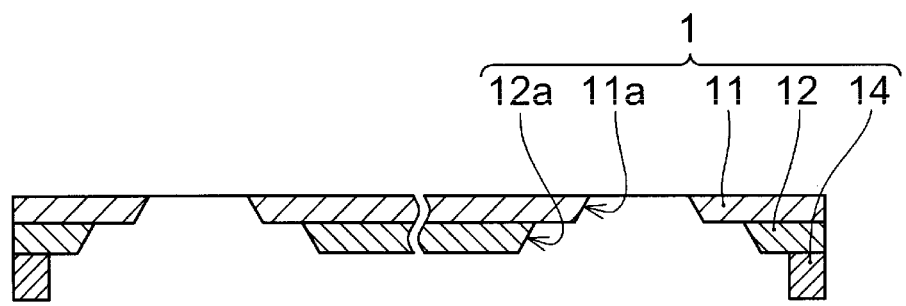
FIG. 5B shows an enlarged view of an example of the vapor deposition mask.
Figure 5C:
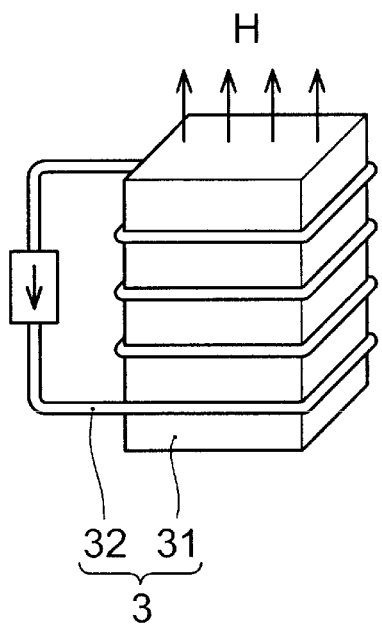
FIG. 5C shows a schematically view of a magnetic field provided by the electromagnet.

As shown in the schematic view of FIG. 5C, the electromagnet 3 is formed by winding the electromagnetic coil 32 around a magnetic core 31 made of, for example, an iron core. In the exemplary configuration shown in FIG. 5A, the vapor deposition mask 1 has a size of, for example, about 1.5 m×1.8 m, and a plurality of the electromagnets, each of which has a magnetic core 31 with a cross section shown in FIG. 5C of about 5 cm square size, are arranged side by side according to the size of the vapor deposition mask 1 (in FIG. 5A, a lateral width is reduced and the smaller number of electromagnets are shown). In the exemplary embodiment shown in FIG. 5A, the electromagnetic coils 32 each wound on each of the respective magnetic cores 31 of the electromagnets 3 (hereinafter an individual electromagnet is referred to as a unit electromagnet) are connected in series. However, the electromagnetic coils 32 of the respective unit electromagnets 3 may be connected in parallel. Further, several units may be connected in series. When taps 32b to 32d are formed on connection portions of the electromagnetic coil 32 of the unit electromagnets, the circuit configuration corresponds to the configuration shown in FIG. 1A as a whole. However, the tap can also be formed in the middle of the electromagnetic coil 32 of the unit electromagnet. A current may be applied independently to a part of the unit electromagnets.

As shown in FIG. 5C, when a DC current flows in the electromagnetic coil 32 of the electromagnet 3, a magnetic field H is generated according to the right-handed screw rule. When a magnetic substance is placed in the magnetic field H, magnetism corresponding to the magnitude of the magnetic field H is induced in the magnetic substance. As described above, the magnitude of the magnetic field H is determined by the product of N·I where N is the number of turns of the electromagnetic coil 32 and I is the magnitude of the flowing current. Thus, the more the number of turns N of the electromagnetic coil 32 or the higher the current I, the higher magnetomotive force N·I will be obtained. However, since the electromagnetic induction is produced according to the rate of change in N·I, a problem will arise if this change is too large, as described above. Thus, the above-described control circuit 7 (FIGS. 1A to 4A) is formed to prevent any drastically change in the magnetic field H.

In the exemplary embodiment shown in FIG. 5A, the periphery of unit electromagnet is fixed with a resin 33, such as silicone rubber, silicone resin and epoxy resin. This resin 33 is not always necessary, but it can fix the unit electromagnet, making the handing of the electromagnet 3 easy. However, according to the presently illustrated embodiment, the electromagnet is used in a vacuum condition, and thus it is also possible to provide no structure around the unit electromagnets, instead of fixing them with the resin 33, so that the electromagnet can be cooled by thermal radiation. Here, it is preferred that a surface of the electromagnet is a treated surface obtained by a blackening treatment such as alumite treatment. The surface of the electromagnet may be a roughening treated surface, for example, a surface with an arithmetic average roughness Ra of 10 μm or higher. In other words, it is preferred that the surface is subjected to a roughening treatment so as to obtain a surface roughness Ra of 10 μm or higher. The surface roughness Ra of 10 μm means that the surface area is increased by 2.18 times, provided that the roughened surface forms ideal hemispheres. As a result, the thermal radiation effect is also increased twice or more. Examples of cooling device include a device which enables such thermal radiation or water cooling, and, in broader sense, an electromagnet having a surface on which the above-described treated surface of the electromagnet 3 is formed will be included. When a large current flows continuously, the electromagnet 3 may possibly generate a heat, and in such a case, it is preferred to cool the electromagnet 3 by water cooling.

As shown in FIG. 5A, the vapor deposition apparatus includes a substrate holder 29 and a mask holder 15. The substrate holder 29 is connected to a driving device (not shown) so as to hold a periphery of the substrate for vapor deposition 2 with a plurality of hook-shaped arms, and so as to move up and down. The substrate for vapor deposition 2, which has been transferred into a chamber by a robot arm, is received by the hook-shaped arms, and, until the substrate for vapor deposition 2 comes close to the vapor deposition mask 1 the substrate holder 29 moves down. In order to enable the alignment, an imaging device (not shown) is also provided. The touch plate 4 is supported by the support frame 41, and is connected via the support frame 41 to the driving device which moves the touch plate 4 down until it abuts on the substrate for vapor deposition 2. By moving the touch plate 4 down, the substrate for vapor deposition 2 is flattened. The vapor deposition apparatus also includes a fine adjustment device to relatively move the substrate for vapor deposition 2 with respect to the vapor deposition mask 1 while imaging alignment marks formed on each one of the vapor deposition mask 1 and the substrate for vapor deposition 2 at the time of aligning the vapor deposition mask 1 and the substrate for vapor deposition 2 of the presently illustrated embodiment. The alignment is performed while stopping the application of current to the electromagnet 3 so as to avoid an undesirable attraction of the vapor deposition mask 1 by the electromagnet 3. Note that although not shown, the vapor deposition apparatus also includes a chamber, which is capable of housing the entire apparatus shown in FIG. 5A, and capable of evacuating an inside of the chamber.

The vapor deposition mask 1 includes a resin film 11, a metal support layer 12 and a frame (frame body) 14 formed in the periphery thereof, and, as shown in FIG. 5A and FIG. 5B, the vapor deposition mask 1 is arranged such that the frame 14 is placed on the mask holder 15. A magnetic material is used for the metal support layer 12. As a result, an attraction force acts between the vapor deposition mask 1 and the magnetic core 31 of the electromagnet 3, and the vapor deposition mask 1 is attracted via the substrate for vapor deposition 2. It should be noted that the metal support layer 12 may be made of a ferromagnetic substance. In this case, the metal support layer 12 is magnetized (a state in which a strong magnetization remains even after removing external magnetic field) by a strong magnetic field of the electromagnet 3. When such a ferromagnetic substance is used, at the time of the separation of the electromagnet 3 and the vapor deposition mask 1 they will be easily separated if a reverse current is applied to the electromagnet 3. Even when a strong magnetic field is generated for such a magnetization, problem due to the electromagnetic induction would not arise because the control circuit 7 (refer to FIGS. 1A to 4A) of the presently illustrated embodiment is provided.

For example, Fe, Co, Ni, Mn or the alloys thereof may be used for the metal support layer 12. Among them, Invar (Fe—Ni alloy) is particularly preferred, because the linear thermal expansion coefficient is only slightly different from that of the substrate for vapor deposition 2 and there is little thermal expansion. The metal support layer 12 may be formed to have a thickness of about 5 μm to 30 μm. Even when the metal support layer 12 is not formed, the surrounding frame 14 may be formed of a magnetic substance.

In the exemplary embodiment shown in FIG. 5B, an opening 11a of the resin film 11 and an opening 12a of the metal support layer 12 have a taper shape with a diameter gradually reduced toward the substrate for vapor deposition 2 (refer to FIG. 5A). The reason for this will be described below. Various vapor deposition sources such as point-shaped, linear-shaped, and surface-shaped vapor deposition sources can be used as a vapor deposition source 5. For example, a line-type vapor deposition source 5 which is formed by linearly arranging crucibles (extends in a direction perpendicular to the paper surface of FIG. 5A) is scanned, for example, from the left end to the right end of the paper surface, so that the vapor deposition is performed on the entire surface of the substrate for vapor deposition 2. This vapor deposition source 5 emits the vapor deposition material in the manner of emission beam of the vapor deposition material with a shape of the cross section of the emission beam being fan-shaped and widening at a constant angle θ, the shape of which is defined by that of the crucible. The opening 12a and the opening 11a of the metal support layer 12 and the resin film 11, respectively, are formed to have a taper shape so as to allow even the vapor deposition particles located in the side of the fan-shaped cross section to reach a predetermined region on the substrate for vapor deposition 2 without being blocked by the metal support layer 12 or the resin film 11. When a large opening 12a is formed in the metal support layer 1, the tapered shape of which is not necessarily formed. However, in view of enhancing the above-described attraction effect of the electromagnet 3, it is preferred to form the opening 12a as small as possible and in such a way so that an opening edge reaches close to the opening 11a of the resin film.

(Vapor Deposition Method)

Next, a vapor deposition method according to an exemplary embodiment of the present invention will be described. As shown in the above-described FIG. 5A, the vapor deposition method according to the exemplary embodiment of the present invention includes: overlapping an electromagnet 3, a substrate for vapor deposition 2 and a vapor deposition mask 1 including a magnetic substance, and attracting the substrate for vapor deposition 2 and the vapor deposition mask 1 to the electromagnet 3 by applying a current from a power supply circuit 6 to the electromagnet 3 (refer to FIGS. 1A to 4A); and depositing a vapor deposition material 51 on the substrate 2 for vapor deposition by allowing the vapor deposition material 51 to travel from a vapor deposition source 5 disposed separately from the vapor deposition mask 1. When the electromagnet 3 attracts the vapor deposition mask 1, the application of the current to the electromagnet 3 is performed so as to gradually change the magnetic field provided by the electromagnet 3. An alignment of the vapor deposition mask 1 with the substrate for vapor deposition 2 may be performed before the attraction by the electromagnet 3 is performed.

As described above, the substrate for vapor deposition 2 is overlapped on the vapor deposition mask 1. The alignment of the substrate for vapor deposition 2 to the vapor deposition mask 1 is performed as follows. The alignment is performed by relatively moving the substrate for vapor deposition 2 with respect to the vapor deposition mask 1 while observing the alignment marks for the alignment formed on each one of the substrate for vapor deposition 2 and the vapor deposition mask 1 with an imaging device. This can be performed with no magnetic field from the electromagnet 3 to be provided, and therefore, enabling the accurate alignment without being affected (attracted) by the magnetic field. Hereby, the opening 11a of the vapor deposition mask 1 can be matched with a vapor deposition region of the substrate for vapor deposition 2 (for example, a pattern of a first electrode on a device substrate in the organic EL display apparatus described in the following). After the alignment, a current is applied to the electromagnetic coil 32. Here, as described above, the control circuit 7 is inserted between the power supply circuit 6 and the electromagnet 3, although not shown in FIG. 5A, to gradually change the magnetic field to be provided by the electromagnet 3, and therefore, the change in magnetic flux becomes gradual. Once the magnetic flux becomes constant, that magnetic flux is maintained and no electromagnetic induction is produced, thus a stable magnetic field can be obtained. As a result, a strong attraction force acts between the electromagnet 3 and the vapor deposition mask 1, and thus sufficiently tight contact is obtained between the substrate for vapor deposition 2 and the vapor deposition mask 1.

Then, as shown in FIG. 5A, the vapor deposition material 51 is deposited on the substrate for vapor deposition 2 by allowing the vapor deposition material 51 to travel (evaporating or sublimating) from the vapor deposition source 5 disposed separately from the vapor deposition mask 1. Specifically, as described above, for example, but not limited to, a line source formed by linearly arranging crucibles may be used. For example, when manufacturing an organic EL display apparatus, multiple kinds of the vapor deposition masks 1, each having the opening 11a formed on some of the pixels, are prepared, and by exchanging the vapor deposition masks 1 from one to another and performing multiple vapor deposition operations the organic layers are formed.

According to this vapor deposition method, an initial rise of the magnetic field (magnetic flux) applied by the electromagnet 3 is made gradual by the control circuit (refer to FIGS. 1A to 4A), thus the electromotive force due to electromagnetic induction is suppressed. As a result, the overcurrent to flow in the substrate for vapor deposition 2 by electromagnetic induction is suppressed, this enables to suppress an effect on the elements or organic material and the like formed on the substrate for vapor deposition 2.

(Method of Manufacturing Organic EL Display Apparatus)

Next, a method of manufacturing an organic EL display apparatus using the vapor deposition method according to the above-described exemplary embodiment will be described. Since, for the manufacturing method other than the vapor deposition method, a known method can be adopted, a method of depositing an organic layer according to the vapor deposition method of the present invention will be described mainly with reference to FIGS. 7A and 7B.

The method of manufacturing an organic EL display apparatus according to an exemplary embodiment of the present invention includes: forming TFTs, a flattening layer (which are not shown) and a first electrode (for example, an anode) 22 on a support substrate 21; overlapping a vapor deposition mask 1 on one surface while aligning; and forming a deposition layer 25 made of organic layers using the above-described vapor deposition method when vapor depositing vapor deposition materials 51. A second electrode 26 (refer to FIG. 7B, a cathode) is formed on the deposition layer 25.

Figure 7A:
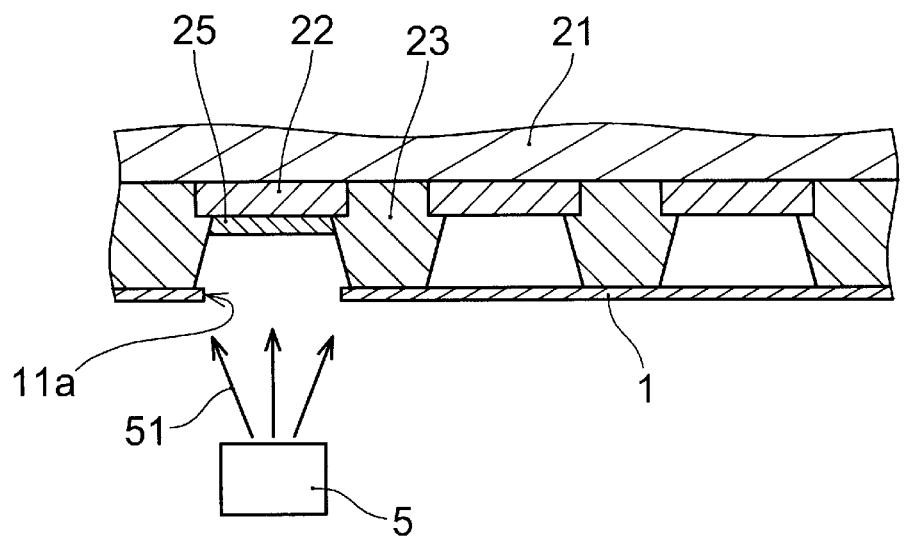
FIG. 7A shows a vapor deposition step according to a method of manufacturing an organic EL display apparatus of the present invention.
Figure 7B:
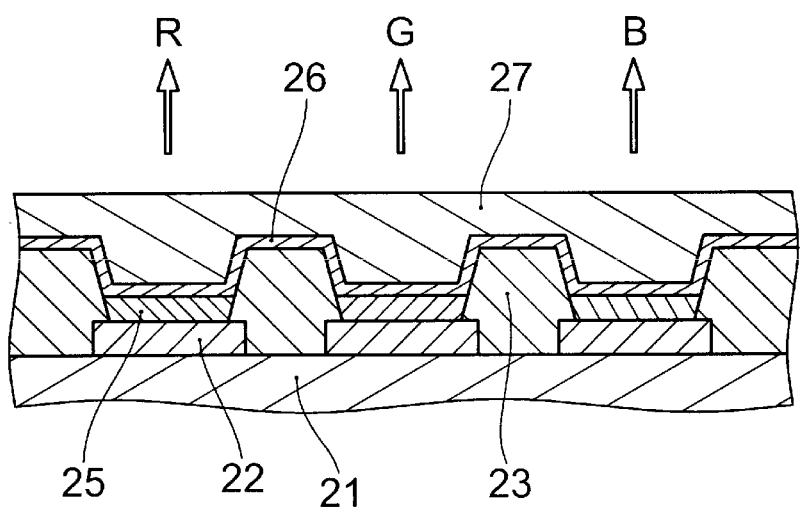
FIG. 7B shows a state in which organic layers are deposited according to the method of manufacturing an organic EL display apparatus of the present invention.

Although not illustrated completely, on the support substrate 21, for example, such as a glass plate, a switching element such as TFT is formed for a RGB sub-pixel of each of the respective pixels, and a first electrode 22, which is connected to the switching element, is formed with a combination of a metal layer, such as Ag or APC, and an ITO layer on the flattening layer. As shown in FIGS. 7A and 7B, an insulating bank 23, which is made of $SiO_2$, acrylic resin, or polyimide resin or the like, to partition the sub-pixels is formed between the sub-pixels. The above-described vapor deposition mask 1 is aligned and fixed on the insulating bank 23 of the support substrate 21. As shown in the above-described FIG. 5A, this fixation is performed by being attracted by an electromagnet 3 provided on a surface of the support substrate 21, which is the surface opposite to the vapor deposition surface, via a touch plate 4. As described above, a magnetic substance is used for the metal support layer 12 of the vapor deposition mask 1 (refer to FIG. 5B), and therefore, when a magnetic field is provided by the electromagnet 3, the metal support layer 12 of the vapor deposition mask 1 is magnetized to generate an attraction force with the magnetic core 31. Even when the electromagnet 3 does not have the magnetic core 31, the attraction is performed by the magnetic field generated by a current flowing in the electromagnetic coil 32. It should be noted that an opening 11a of the vapor deposition mask 1 is formed into a size smaller than a space between the surfaces of the insulating banks 23. By preventing the adherence of an organic material to a side wall of the insulating bank 23 as much as possible, a decrease in light-emitting efficiency of the organic EL display apparatus can be prevented.

Under this condition, as shown in FIG. 7A, an organic material 51 travels from a vapor deposition source (crucible) 5 inside the vapor deposition apparatus and is deposited on the support substrate 21 only in an area where the opening 11a of the vapor deposition mask 1 is formed, resulting in the formation of an deposition layer 25 made of organic layers on the first electrode 22 of a desired sub-pixel. As described above, the opening 11a of the vapor deposition mask 1 is formed smaller than the space between the surfaces of the insulating banks 23, and therefore, the organic material 51 is less likely to be deposited on the side wall of the insulating bank 23. As a result, as shown in FIGS. 7A and 7B, the deposition layer 25 formed of organic layers is deposited almost only on the first electrode 22. This vapor deposition step can also be performed by sequentially exchanging vapor deposition masks 1 for respective sub-pixels. A vapor deposition mask 1 capable of depositing the same material to a plurality of sub-pixels at the same time may be used. When the vapor deposition mask 1 is exchanged from one to another, the power supply circuit 6 (refer to FIGS. 1A to 4A) is turned off so as to remove a magnetic field provided by the electromagnet 3 (not shown in FIG. 7A: refer to FIG. 5A) in the metal support layer 12 (refer to FIG. 5B) of the vapor deposition mask 1. Also in this case, the control circuit 7 is configured to operate so that the elements such as TFTs formed on the support substrate 21 can reduce an effect of the electromagnetic induction.

In the exemplary embodiment shown in FIGS. 7A and 7B, the deposition layer 25 formed of organic layers is simply illustrated by a one layer, but the deposition layer 25 may be formed with plural layers made of different materials. For example, as a layer abutting on the anode 22, a hole injection layer made of a material that has an excellent consistency with ionization energy and capable of improving a hole injection property may be provided. Onto this hole injection layer, a hole transport layer capable of improving a stable hole transport and confining electrons within a light emitting layer (energy barrier) may be formed by using, for example, an amine-based material. Further thereon, a light emitting layer to be selected according to the light emission wavelength is formed using $Alq_3$, which is doped with, for example, a red or green organic fluorescent material for red or green light emission, respectively. Further, a DSA-based organic material may be used as a blue material. On the light emitting layer, an electron transport layer capable of improving an electron injection property and stably transporting electrons may be formed by using $Alq_3$ or the like. A deposition layer 25 made of organic materials is formed by depositing each of those layers in a thickness of about several tens of nanometers. Note that an electron injection layer made of, for example, LiF or Liq may be provided between the organic layer and the metal electrode in order to improve an electron injection property. In the presently illustrated embodiment, the elements including these layers are considered as the deposition layer 25 made of organic materials. Although such deposition layer 25 may be affected by electromagnetic induction, in the presently illustrated embodiment, the control circuit 71-75 (FIGS. 1A to 4A) is connected between the power supply circuit 6 and the electromagnet 3 as described above, making the rise gradual, thereby suppressing the effect of electromagnetic induction.

Among the deposition layer 25 made of organic materials, the light emitting layer is formed by depositing an organic layer made of a material selected for each of RGB colors. When the light emission performance is regarded as important, for, for example, the hole transport layer or the electron transport layer it is preferred to independently deposit a material suitable for each of the light emitting layers. However, when considering material cost, the deposition may be performed using the same material common to two or three of the RGB colors. When the material common to two or more colors of the sub-pixels is deposited, the vapor deposition mask 1 on which the openings are formed for the common sub-pixels is formed. When the vapor deposition layers are different between individual sub-pixels, one vapor deposition mask 1 may be used for, for example, R sub-pixels to sequentially vapor-deposit the respective organic layers. Further, when a common organic layer is deposited for each of RGB, the organic layers for each of the respective sub-pixels are vapor-deposited up to the underside of the common organic layer, and when forming the common organic layer, an organic layer for all pixels is vapor-deposited at one time using a vapor deposition mask 1 having openings formed for RGB. Note that for the mass production, many chambers of the vapor deposition apparatus may be arranged side by side and each provided with different vapor deposition masks 1, and by moving the support substrate 21 (substrate for vapor deposition 2) between the respective vapor deposition apparatus, the vapor deposition can be performed sequentially.

After the formation of all of the deposition layers 25 comprising organic layers including, for example, the electron injection layer, such as LiF layer, is completed, the power supply circuit 6 of the electromagnet 3 is turned off, and the electromagnet 3 is separated from the vapor deposition mask 1 as described above. Then, the second electrode 26 (for example, a cathode) is formed on its entire surface. Since the apparatus of the exemplary embodiment shown in FIG. 7B is a top emission-type and emits light from a surface opposite to the support substrate 21 illustrated in the figure, the second electrode 26 is formed of a transparent material such as a thin Mg—Ag eutectic layer. Alternatively, Al or the like may be used. Note that when an apparatus is a bottom emission-type to emit light from the surface of the support substrate 21 side, ITO, $In_3O_4$ or the like may be used for the first electrode 22 and a low work function metal such as Mg, K, Li, Al or the like may be used for the second electrode 26. A protective layer 27 made of, for example, $Si_3N_4$ or the like may be formed on a surface of the second electrode 26. It should be noted that the entire surface is configured to be sealed by a sealing layer made of glass, resin film or the like (not shown) to prevent the deposition layer 25 made of organic materials from absorbing water. Further, the apparatus may be configured to include organic layers they are communalized as much as possible and a color filter may be provided on a front side.

SUMMARY (1) The vapor deposition apparatus according to a first embodiment of the present invention comprises: an electromagnet; a substrate holder for holding a substrate for vapor deposition to be placed in a position facing one magnetic pole of the electromagnet; a vapor deposition mask comprising a magnetic substance and provided at a surface of the substrate for vapor deposition held by the substrate holder, the surface being an opposite surface to a surface facing the one magnetic pole of the electromagnet; a vapor deposition source provided so as to face the vapor deposition mask and configured to evaporate or sublimate a vapor deposition material; a power supply circuit for driving the electromagnet; and a control circuit connected between the power supply circuit and the electromagnet to gradually change a magnetic field provided by the electromagnet when a current is applied to the electromagnet.

The vapor deposition apparatus according to the first embodiment of the present invention is configured to attract the vapor deposition mask by the electromagnet, and therefore, the alignment between the substrate for vapor deposition and the vapor deposition mask can be easily performed without applying a magnetic field. Further, sufficiently tight contact is obtained between the vapor deposition mask and the substrate for vapor deposition to be sandwiched by the application of magnetic field. Moreover, a control circuit to make the change in magnetic field provided by the electromagnet gradual is inserted between the power supply circuit and the electromagnetic coil of the electromagnet, and therefore, even when the current is applied to the electromagnet, the effect of electromagnetic induction, which is produced at the time of current input, on the elements such as TFTs formed on the substrate for vapor deposition can be suppressed.

(2) It is preferred that the control circuit comprises a circuit, the circuit making a rise time from when a current is applied to an electromagnetic coil of the electromagnet to when the current in the electromagnetic coil reaches a predetermined value the order of milliseconds. This allows the rise time to be increased to 100 times more of the conventional rise time and reduces the change in magnetic flux, and therefore, the effect of electromagnetic induction can be prevented.

(3) The control circuit may also be a circuit configured to gradually change the magnetic field provided by the electromagnet by sequentially switching a connection between the power supply circuit and each of a plurality of taps formed in the middle of the coil of the electromagnet. This configuration makes possible to increase the number of turns of the electromagnetic gradually, and therefore, the magnetic field can be gradually increases, increasing the rise time.

(4) The control circuit may also have a circuit configuration in which the power supply circuit comprises an AC power supply and a transformer with a secondary coil comprising a plurality of taps, the control circuit comprises a switching circuit to sequentially switch between each of the plurality of taps of the secondary coil and a rectifier circuit to convert AC output from the switching circuit to DC, and an output of the rectifier circuit is connected to the coil of the electromagnet. Also in this configuration, the current increases gradually, and therefore, the magnetic field can be gradually increases, increasing the rise time.

(5) The control circuit may also have a circuit configuration in which the control circuit is formed of a chopper control circuit, and in the chopper control circuit, a switching circuit and an inductive reactance element are connected in series between a first terminal of a pair of output terminals of the power supply circuit and one end of the coil of the electromagnet, and a diode is connected in parallel to the electromagnet between a second terminal of the pair of output terminals of the power supply circuit and a connection point of the switching circuit to the inductive reactance element and arranged in the orientation opposite to a polarity of the power supply circuit. This configuration allows the rise time to be intermittent, and therefore, as with the above-described configuration the rise time can be increased.

(6) By forming the switching circuit with the one selected from a GTO thyristor, an IGBT, a diode, a bipolar transistor and a field effect transistor, the rise time can be intermittent with a simple configuration.

(7) The control circuit can comprise a capacitive reactance element connected in parallel to the electromagnet between a pair of output terminals of the power supply circuit. This configuration can increase the rise time by simply inserting, for example, a capacitor.

(8) It is preferred that the capacitive reactance element has a capacitance of at least 5000 μF, because it can make the current rise increase gradually so that problem due to electromagnetic induction will not arise. Further, the use of the capacitive reactance can give an excellent result in view of preventing the effect of electromagnetic induction, because it also automatically makes the falling current decrease gradual when the power supply circuit is turned off.

(9) The magnetic substance of the vapor deposition mask may be a ferromagnetic substance.

(10) When the electromagnet comprises a plurality of unit electromagnets, the plurality of unit electromagnets being provided for each of the one vapor deposition mask, and the power supply circuit comprises a circuit configured so that at least one of the plurality of unit electromagnets independently changes a generated magnetic field, it is possible to adjust the magnetic field of the individual unit electromagnets.

(11) It is preferred that a cooling device for cooling the electromagnet is provided close to the electromagnet, because it facilitates a cooling of the electromagnet even if the current is large.

(12) It is preferred that the electromagnet has a surface which is at least one of treated surfaces selected from an alumite-treated surface, a blackening-treated surface and a roughening-treated surface, because it improves heat radiation.

(13) It is further preferred that the roughening-treated surface has a roughness Ra of 10 μm or higher.

(14) The vapor deposition method according to a second embodiment of the present invention comprises: overlapping an electromagnet, a substrate for vapor deposition and a vapor deposition mask comprising a magnetic substance, and attracting the substrate for vapor deposition and the vapor deposition mask to the electromagnet by applying a current from a power supply circuit to the electromagnet; and depositing a vapor deposition material on the substrate for vapor deposition by allowing the vapor deposition material to travel from a vapor deposition source disposed separately from the vapor deposition mask, wherein, when attracting the vapor deposition mask to the electromagnet, the application of the current is performed so as to gradually change a magnetic field provided by the electromagnet.

According to the vapor deposition method of the second embodiment of the present invention, the alignment between the substrate for vapor deposition and the vapor deposition mask can be easily performed, because it can be performed without an attraction by the electromagnet. After that, by driving the electromagnet, the attraction of the substrate for vapor deposition and the vapor deposition mask can be performed completely. Here, the magnetic field is generated gradually, thereby suppressing a damage of the elements formed on the substrate for vapor deposition as well as deterioration in property of the elements or organic layers.

(15) It is preferred that the application of the current to the electromagnet is performed such that a rise time from when the current is applied to an electromagnetic coil of the electromagnet to when the current in the electromagnetic coil reaches a predetermined value is the order of milliseconds. The increase in the rise time decreases the change in magnetic flux, making it possible to reduce an effect of the electromagnetic induction.

(16) By gradually changing a magnetic field provided by the electromagnet is performed by causing a current to flow in the electromagnet with different number of turns of the electromagnetic coil, a magnetic field provided by the electromagnet can be changed gradually.

(17) By performing the application of the current to a coil of the electromagnet through a reactance element, the generation of magnetic field can be gradually.

(18) Further, the method of manufacturing an organic EL display apparatus according to a third embodiment of the present invention comprises: forming at least TFTs and a first electrode on a support substrate; forming a deposition layer made of organic materials on the support substrate by vapor-depositing an organic material using the vapor deposition method according to any of (14) to (17) described above; and forming a second electrode on the deposition layer.

The method of manufacturing an organic EL display apparatus according to the third embodiment of the present invention can prevent deterioration in property of the elements or organic layers formed on the support substrate when manufacturing the organic EL display apparatus, and thus a display screen with a fine pattern is obtained.

REFERENCE SIGNS LIST

1 Vapor deposition mask
2 Substrate for vapor deposition
3 Electromagnet
4 Touch plate
5 Vapor deposition source
6 Power supply circuit
7 Control circuit
11 Resin film
11a Opening
12 Metal support layer
12a Opening
14 Frame
15 Mask holder
21 Support substrate
22 First electrode
23 Insulating bank
25 Deposition layer
26 Second electrode
27 Protective layer
29 Substrate holder 31 Magnetic core
32 Electromagnetic coil
33 Resin
41 Support frame

The invention claimed is:

1. A vapor deposition apparatus comprising:
an electromagnet;
a substrate holder for holding a substrate for vapor deposition to be placed in a position facing one magnetic pole of the electromagnet;
a vapor deposition mask comprising a magnetic substance and provided at a surface of the substrate for vapor deposition held by the substrate holder, the surface being an opposite surface to a surface facing the one magnetic pole of the electromagnet;
a vapor deposition source provided so as to face the vapor deposition mask and configured to evaporate or sublimate a vapor deposition material;
a power supply circuit for driving the electromagnet; and
a control circuit connected between the power supply circuit and the electromagnet, the control circuit increasing a rise time from when a current is applied to an electromagnetic coil of the electromagnet to when the current in the electromagnetic coil reaches a predetermined value, and a falling time from when the power supply circuit is cut off to when the current in the electromagnetic coil reaches 0, to reduce an effect of an electromotive force to be generated by electromagnetic induction when a current applied to the electromagnetic coil is changed rapidly.

2. The vapor deposition apparatus according to claim 1, wherein the control circuit comprises a circuit, the circuit making the rise time and the falling time 10 milliseconds or more.

3. The vapor deposition apparatus according to claim 1, wherein the control circuit comprises a circuit, the circuit making the rise time and the falling time 1 milliseconds or more, 10 milliseconds or less.

4. The vapor deposition apparatus according to claim 1, wherein the predetermined value of the current is a current to generate a predetermined magnetic field.

5. The vapor deposition apparatus according to claim 1, wherein the control circuit is formed so that the current is changed step by step in the rise time or the falling time.

6. The vapor deposition apparatus according to claim 1, wherein the substrate for vapor deposition comprises TFT and/or an organic layer for constituting an organic EL display element.

7. The vapor deposition apparatus according to claim 1, wherein the vapor deposition mask is a complex mask comprising a resin film and a metal support layer made of magnetic substance.

8. A vapor deposition method, comprising:
overlapping an electromagnet, a substrate for vapor deposition and a vapor deposition mask comprising a magnetic substance, and attracting the substrate for vapor deposition and the vapor deposition mask to the electromagnet by applying a current from a power supply circuit to the electromagnet, by using the vapor deposition apparatus of claim 1; and
depositing a vapor deposition material on the substrate for vapor deposition by allowing the vapor deposition material to travel from a vapor deposition source disposed separately from the vapor deposition mask,
wherein, when attracting the vapor deposition mask to the electromagnet, the application of the current to the electromagnet is performed so as to gradually change a magnetic field provided by the electromagnet.

9. A method of manufacturing an organic EL display apparatus comprising:
forming at least TFTs and a first electrode on a support substrate;
forming a deposition layer made of organic materials on the support substrate by vapor-depositing an organic material using the vapor deposition method according to claim 8; and
forming a second electrode on the deposition layer.

* * * * *